United States Patent [19]
Kawasaki et al.

[11] Patent Number: 5,631,463
[45] Date of Patent: May 20, 1997

[54] DISPLACEMENT ELEMENT, PROBE EMPLOYING THE ELEMENT, AND APPARATUS EMPLOYING THE PROBE

[75] Inventors: Takehiko Kawasaki, Atsugi; Keisuke Yamamoto, Yamato; Yoshio Suzuki, Atsugi, all of Japan

[73] Assignee: Canon Kabushiki Kaisha, Tokyo, Japan

[21] Appl. No.: 592,606

[22] Filed: Jan. 26, 1996

Related U.S. Application Data

[63] Continuation of Ser. No. 112,317, Aug. 27, 1993, abandoned.

[30] Foreign Application Priority Data

Sep. 1, 1992 [JP] Japan .................................. 4-255431
Jul. 27, 1993 [JP] Japan .................................. 5-203709

[51] Int. Cl.$^6$ .................................................. H01J 37/00
[52] U.S. Cl. .................................................. 250/306; 310/330
[58] Field of Search .................................. 250/306, 307; 310/328, 330, 331, 332, 339; 369/126

[56] References Cited

U.S. PATENT DOCUMENTS

| | | |
|---|---|---|
| 4,047,214 | 9/1977 | Francombe et al. ................. 357/23 |
| 4,320,365 | 3/1982 | Black et al. ........................ 333/187 |
| 4,471,256 | 9/1984 | Igashira et al. ..................... 310/328 |
| 4,570,098 | 2/1986 | Tomita et al. ....................... 310/346 |
| 4,575,822 | 3/1986 | Quate .................................. 365/174 |
| 4,912,822 | 4/1990 | Zdeblick et al. ................... 250/307 |
| 5,187,367 | 2/1993 | Miyazaki et al. ................... 250/306 |
| 5,209,119 | 5/1993 | Polla et al. ........................... 73/723 |
| 5,268,571 | 12/1993 | Yamamoto et al. ................. 250/306 |
| 5,389,196 | 2/1995 | Bloomstein et al. ............... 156/643 |

OTHER PUBLICATIONS

G. Binning, et al., "Surface Studies by Scanning Tunneling Microscopy", Physical Review Letters, vol. 49, No. 1, pp. 57–61 (Jul. 1982).

K.E. Petersen, "Dynamic Micromechanics on Silicon: Techniques and Devices" IEEE Transactions on Electron Devices, vol. ED–25, No. 10, pp. 1241–1250, (Oct. 1978).

E.E. Ehrichs, et al, "Etching of Silicon (111) with the Scanning Tunneling Microscope", Journal of Vacuum Science & Technology, Second Series, vol. 8, No. 1, pp. 571–573 (Feb. 1990).

Primary Examiner—Bruce C. Anderson
Attorney, Agent, or Firm—Fitzpatrick, Cella, Harper & Scinto

[57] ABSTRACT

A cantilever type displacement element includes a piezoelectric film and an electrode provided on each face of the film to displace the film by convence piezoelectric effect. The electrodes are formed from platinum or palladium. The displacement element constitutes a cantilver type probe having a tip on the free end of the element. The probe is used in a scanning tunneling microscope or an information processing apparatus.

13 Claims, 6 Drawing Sheets

DISPLACEMENT ELEMENT, PROBE EMPLOYING THE ELEMENT, AND APPARATUS EMPLOYING THE PROBE

This application is a continuation of Application No. 08/112,317, filed Aug. 27, 1993, now abandoned.

BACKGROUND OF THE INVENTION

1. Field of the Invention

The present invention relates to a cantilever type displacement element which is displaced by the converse piezoelectric effect. The present invention also relates to a cantilever type probe employing the above element, and a scanning tunneling microscope and an information processing apparatus employing the above probe.

2. Related Background Art

In recent years, a scanning tunneling microscope (hereinafter referred to as "STM") has been developed which enables direct observation of electronic structure of atoms on the surface of a conductor (G. Binnig et al. Phys. Rev. Lett. 49 (1982) 57). The STM has made practicable the measurement of a real space image of a single crystal material as well as of an amorphous material with exceedingly high resolution power (nanometer or finer).

The technique of STM is being studied in various application fields such as observation, evaluation, and micromachining of semiconductors and high polymer materials at an atomic order or a molecular order (E. E. Ehrichs, 4th International Conference on Scanning Tunneling Microscopy/Spectroscopy, '89, S-13-3), and in application fields of recording-reproducing apparatuses.

For processing of calculation information by computers, etc., in particular, the recording apparatus is required increasingly to have a larger capacity. Furthermore, the recording apparatus is required to be miniaturized as the result of miniaturization of microprocessors and improvement of computation ability resulting from the progress of semiconductor processing technique. To satisfy such requirements, a recording-reproducing apparatus is disclosed (U.S. Pat. No. 4,575,822), which apparatus conducts recording by changing the work function of the surface of a recording medium by application of voltage by means of a transducer comprising a tunnel current-generating probe provided on a driving means which is capable of changing finely the distance from the recording medium, and conducts reading by detecting the change of the tunneling current caused by the change of the work function. This apparatus has minimum recording areas of 10 nm square.

In such an apparatus, the probe is required to scan a sample within a range of from several nm to several µm, and therein a piezoelectric element is used as the moving mechanism. An example of the moving mechanism is a tripod type one in which three piezoelectric elements are arranged perpendicularly to each other in x-y-z axis directions and a probe is provided at the intersection point of the axes. Another example is a cylinder type one in which divided electrodes are provided on the peripheral surface of a cylindrical piezoelectric element which is fixed at one end and is provided with a probe at the other end, and the cylinder is deformed in accordance with the respective divided electrodes for scanning.

Recently, a probe-moving mechanism has come to be formed finely by micro-machining by utilizing semiconductor machining technique (K. E. Peterson, IEEE Trans. on Electron Devices, Vol. ED-25, No. 10, p. 1241, 1978). FIGS. 5A and 5B illustrate a cantilever composed of a piezoelectric bimorph formed on an Si substrate by micro-machining technique (T. R. Albrecht, "Microfabrication of Integrated Scanning Tunneling Microscope", Proceedings of 4th International Conference on Scanning Tunneling Microscopy/Spectroscopy, '89, S10-2).

FIG. 5A is a perspective view of the cantilever, and FIG. 5B is a cross-sectional view thereof at the line A—A' in FIG. 5A. The cantilever is formed on a substrate 1 by laminating a layer of bisected electrodes 2a, 2b, a piezoelectric ZnO layer 3, an intermediate electrode 4, a piezoelectric ZnO layer 5, and bisected electrodes 6a, 6b, and then removing a part of the Si substrate by anisotropic etching so that the cantilever is supported at its one end by the unremoved substrate portion. At the tip of the cantilever constructed of the piezoelectric bimorph, a probe 7 made of metal or the like is attached by adhesion or other bonding method to detect tunneling current through a drawing-out electrode 16. Such a cantilever, which has a bimorph construction, is capable of giving a large displacement especially in a vertical direction advantageously.

The micro-machining technique enables fine construction of the probe-driving mechanism, and makes easier the multiplication of the probe for raising the speed of writing and reading of information with the recording-reproducing apparatus. The probe-driving mechanism itself prepared by utilizing a thin film technique for a piezoelectric material can be incorporated advantageously into an IC process which is primarily used for Si semiconductors.

The material for the electrode of the cantilever, in most cases for device fabrication, is Al or Au which has a relatively low melting point and characteristically makes easier the thin film electrode formation.

In preparation of the element shown in FIGS. 5A and 5B, many layers of electrodes and piezoelectric substances have to be laminated. Therefor, the thickness and the internal stress of each layer is required to be strictly controlled because the cantilever which has a thin film lamination construction may cause peeling at the interfaces between the electrode and the piezoelectric material owing to the stress in the layers.

The piezoelectric film is composed of a nitride or an oxide. At the interface between the piezoelectric material and the electrode, materials of completely different natures are bonded, which may cause great stress therein. In the case of laminated thin films, the entire stress at the interfaces is not negligible in comparison with the case of a bulky or thick material. Especially, a large difference of the internal stresses between the electrode film and the piezoelectric film will give rise to many problems. Therefore, smaller internal stresses of the respective layers and a smaller difference of the stresses are desired.

When a base metal such as Al is used as the electrode material, a passivation film is desirably provided to prevent corrosion. However, the lamination of a passivation film on a thin film cantilever makes the aforementioned control of the stress more difficult, and the passivation film may be cracked by the bending motion of the element itself. Accordingly, a high level of technique is required for making an element of high durability.

When Au, a noble metal, is used as the electrode material, the electrode tends to have a large remaining internal stress, although the electrode is chemically stable and less reactive to the piezoelectric material and has excellent properties.

FIG. 3 shows the dependence of the internal stresses of thin metal films on heat treatment temperature. The heat treatment was conducted at 200° C., the temperature of the substrate required for obtaining satisfactory crystalline thin film of the piezoelectric material like zinc oxide. As shown in FIG. 3, Au has relatively small internal stress immediately after the film formation, whereas it comes to have a larger tensile stress after heat treatment at 200° C. Consequently, the gold electrode after the formation of piezoelectric film has a large remaining internal stress, and tends to cause peeling of the film.

SUMMARY OF THE INVENTION

The present invention intends to provide a cantilever type displacement element which causes no peeling at the interface between the piezoelectric film and the electrode, and can be formed by lamination at a high yield.

The present invention also intends to provide a cantilever type probe employing the cantilever type displacement element, and a scanning tunneling microscope and an information processing apparatus employing the cantilever type probe.

The present invention prevents peeling between the piezoelectric film and the electrode by use of a material having smaller internal stress after heat treatment for piezoelectric film formation.

The cantilever type displacement element of the present invention comprises a piezoelectric film and an electrode provided on each face of the film to displace the film by converse piezoelectric effect, the electrode being formed from platinum or palladium.

The cantilever type probe of the present invention comprises the aforementioned cantilever type displacement element and a tip provided on the free end of the displacement element.

The scanning tunneling microscope of the present invention comprises the aforementioned cantilever type probe and reads out information from a sample placed in opposition.

The information processing apparatus of the present invention comprises the aforementioned cantilever type probe and writes and/or reads out information to or from a medium placed in opposition to the probe by use of the probe.

DESCRIPTION OF THE PREFERRED EMBODIMENTS

Figure 3:
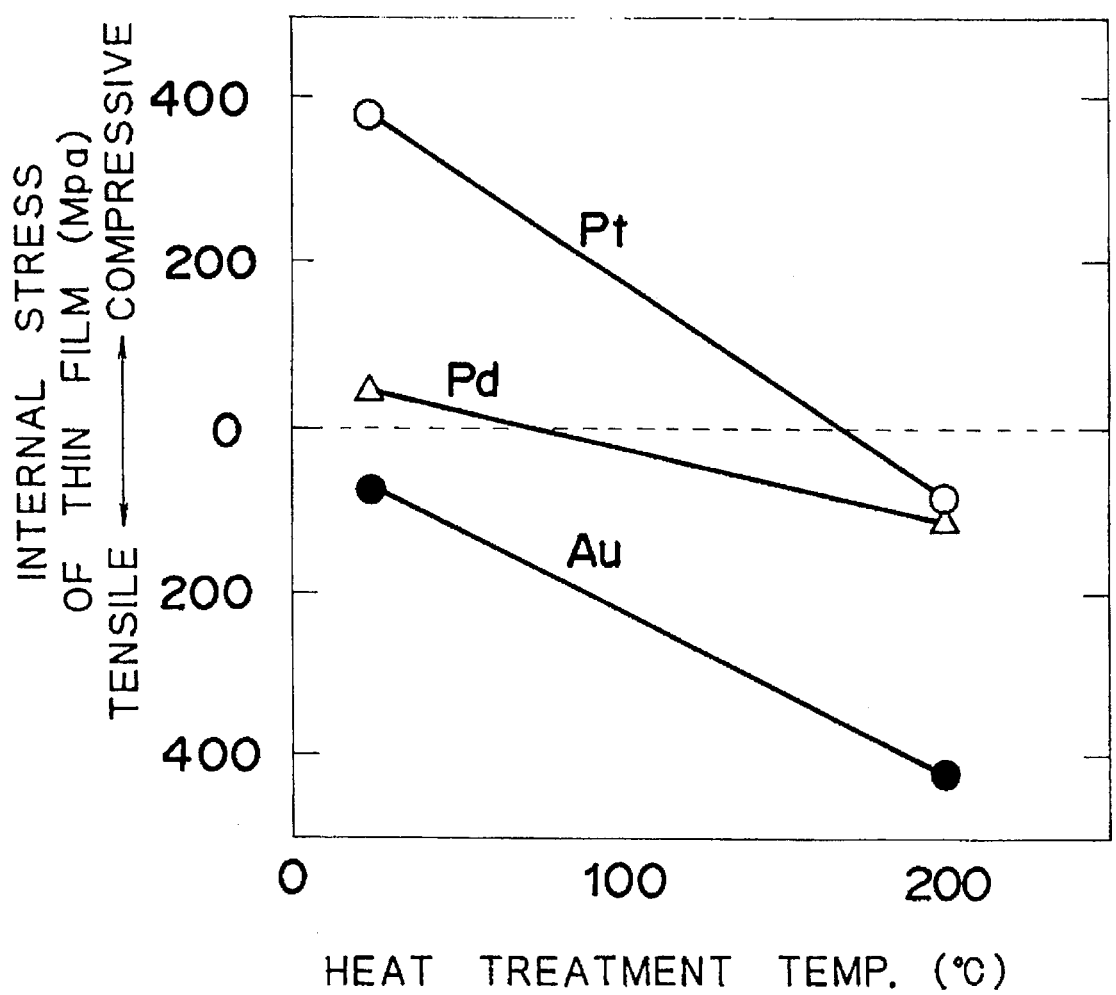
FIG. 3 shows the dependence of the internal stress in metal thin films employed for the electrode of the displacement element on the heat treatment temperature.

The internal stress is explained of the thin films of Pt and Pd for the electrode of the displacement element of the present invention. FIG. 3 shows the dependence of internal stress in metal thin films on heat treatment temperature. The aforementioned Au comes to have large internal stress by heat treatment at a temperature of film formation of the piezoelectric film. On the contrary, Pt has a large compression stress immediately after film formation, but comes to have extremely low internal stress by stress relaxation after heat treatment at 200° C. which is the temperature of piezoelectric film formation. Pd has small compression stress immediately after the film formation, and has small internal stress also after heat treatment at 200° C. Accordingly, use of Pt or Pd as the electrode material reduces greatly the internal stress in the thin electrode film after the preparation of the element by lamination of a thin electrode film and a thin piezoelectric film.

Pt or Pd, which has a relatively high melting point, is formed into a thin film usually by sputtering, preferably by RF (Radio Frequency) sputtering or ion beam sputtering. Otherwise, vapor deposition by use of electron beam heating, ion plating, and ion beam vapor deposition are also useful.

The Pt or Pd thin film is preferably oriented highly in the direction of (111). In evaluation of crystal orientation in the thin film by X-ray diffraction, diffraction lines (e.g. caused by the (200) plane) are observed in addition to the diffraction line of the (111) plane when the orientation is low. In the X-ray diffraction measurement of the Pt or Pd electrode film of the element of the present invention, the ratio of the intensity $I_{(200)}$ caused by the crystal plane (200) to the intensity $I_{(111)}$ caused by the crystal plane (111) is preferably in the range represented by the inequality below:

$$I_{(200)}/I_{(111)} < 0.02$$

The electric characteristics of the laminated piezoelectric thin film is improved by use of the above thin film as the underlying electrode.

In order to prepare a thin electrode film having such a high orientation degree, the thickness of the thin electrode film is preferably not less than 20 nm. If the film thickness is below 20 nm, a layer having disordered orientation given by mismatch between the substrate and the thin electrode film or other causes exerts strong influence over the entire thin electrode film.

The same reason is applied to the piezoelectric film, and to obtain a highly oriented thin film, the thickness of the piezoelectric film is preferably not less than 50 nm.

The material for the piezoelectric film may be any material that exhibits piezoelectric characteristics, including AlN, ZnO, $Ta_2O_3$, $PbTiO_3$, $Bi_4Ti_3O_{12}$, $BaTiO_3$, $LiNbO_3$, and so forth. Of these, AlN and ZnO are preferred which can be formed into a film at a relatively low substrate temperature.

The piezoelectric film may be formed by vapor deposition, sputtering, CVD, a sol-gel process, or a like method or combination thereof with an assisting means such as plasma, active gas, and light irradiation, but is not limited thereto.

The construction of the displacement element of the present invention is not limited, provided that the displacement element has a piezoelectric thin film, and, on each of the faces thereof, an electrode for displacing the thin film by piezoelectric effect. An example is a bimorph structure having a five-layered lamination film having a lower electrode, a first piezoelectric thin film, an intermediate electrode, a second piezoelectric thin film, and an upper electrode in the named order. Another example has such a structure that an electrode is provided on each face of a piezoelectric film, and further an elastic thin film is provided on one of the faces thereof. A further example has such a structure that the electrode is divided into pieces to displace the element in a desired direction.

The cantilever type displacement probe employing the displacement element of the present invention is prepared by providing a tip for input and output of information at the free end of the element. The material for the tip for input and output of information includes noble metals such as Pt, Au, Ru, and Pd; metals such as W; alloys thereof; lamination films thereof; TiC, and the like. The tip is provided by bonding a small piece of the above material, or by depositing the above material in a thin film and then working it into a desired shape by etching, electropolishing, or a like method.

The present invention is described by reference to the drawings.

FIGS. 1A to 1E are cross-sectional views illustrating roughly a typical example of the cantilever type displacement element and an element of a cantilever type probe, and the steps for preparation thereof.

Figure 1A:
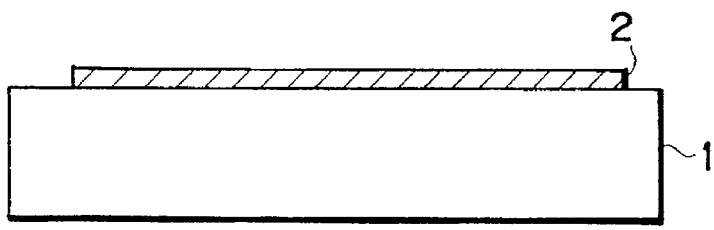
FIGS. 1A to 1E illustrate roughly a typical example of the displacement element and the cantilever type probe, and a process for production thereof of the present invention.
Figure 1B:
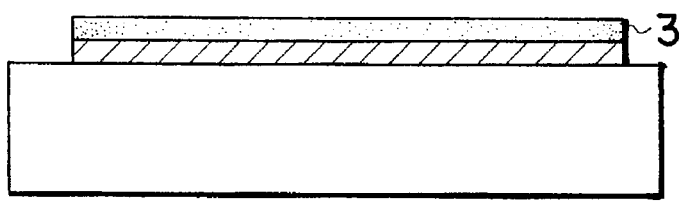
Figure 1C:
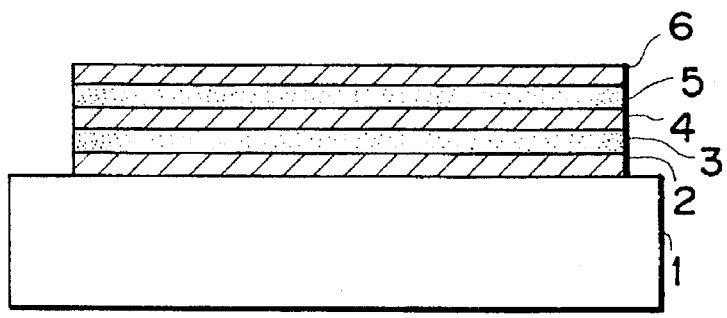
Figure 1D:
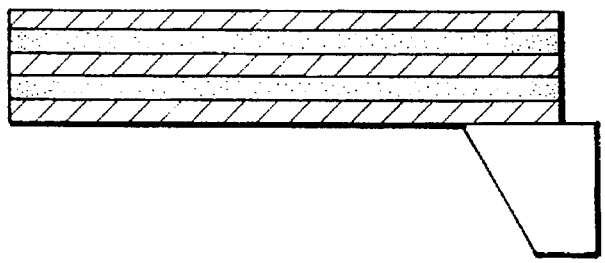

The displacement element of the present invention is prepared in the following manner. A lower electrode 2 is formed on a substrate 1 as shown in FIG. 1A. Then a first piezoelectric thin film 3 is formed thereon as shown in FIG. 1B. Further thereon, an intermediate piezoelectric thin film 5, a second electrode 4, and an upper electrode 6 are deposited successively in lamination as shown in FIG. 1C. Patterning is conducted on deposition of the respective layer or after completion of lamination by deposition, and the layers are worked into a shape of a desired cantilever. Then, the substrate under the element is removed except the one end portion of the element as shown in FIG. 1D.

Figure 1E:
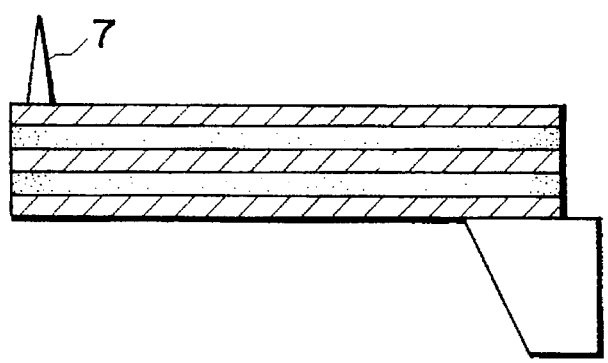

The cantilever type probe employing the displacement element is prepared by providing a tip 7 for input and output of information on the free end portion of the displacement element as shown FIG. 1E.

The patterning of the above element portion is conducted by photolithography by using a conventional photoresist in combination with dry etching such as reactive ion etching, or with wet etching by an etching solution such as an acid and an alkali. The removal of the substrate 1 under the element is conducted by anisotropic etching of the substrate. Typically, in the case of a usual Si substrate, a mask layer is formed with $Si_3N_4$ or SiON, the mask layer is treated for patterning, and then Si is etched by aqueous potassium hydroxide solution.

The entire thickness of the displacement element is preferably not more than 5 μm in order to keep the displacement large for the driving voltage and to enable fine machining. Thereby, a thin cantilever type displacement element, which exhibits large displacement and is capable of being integrated, is produced in high yield.

Figure 4:
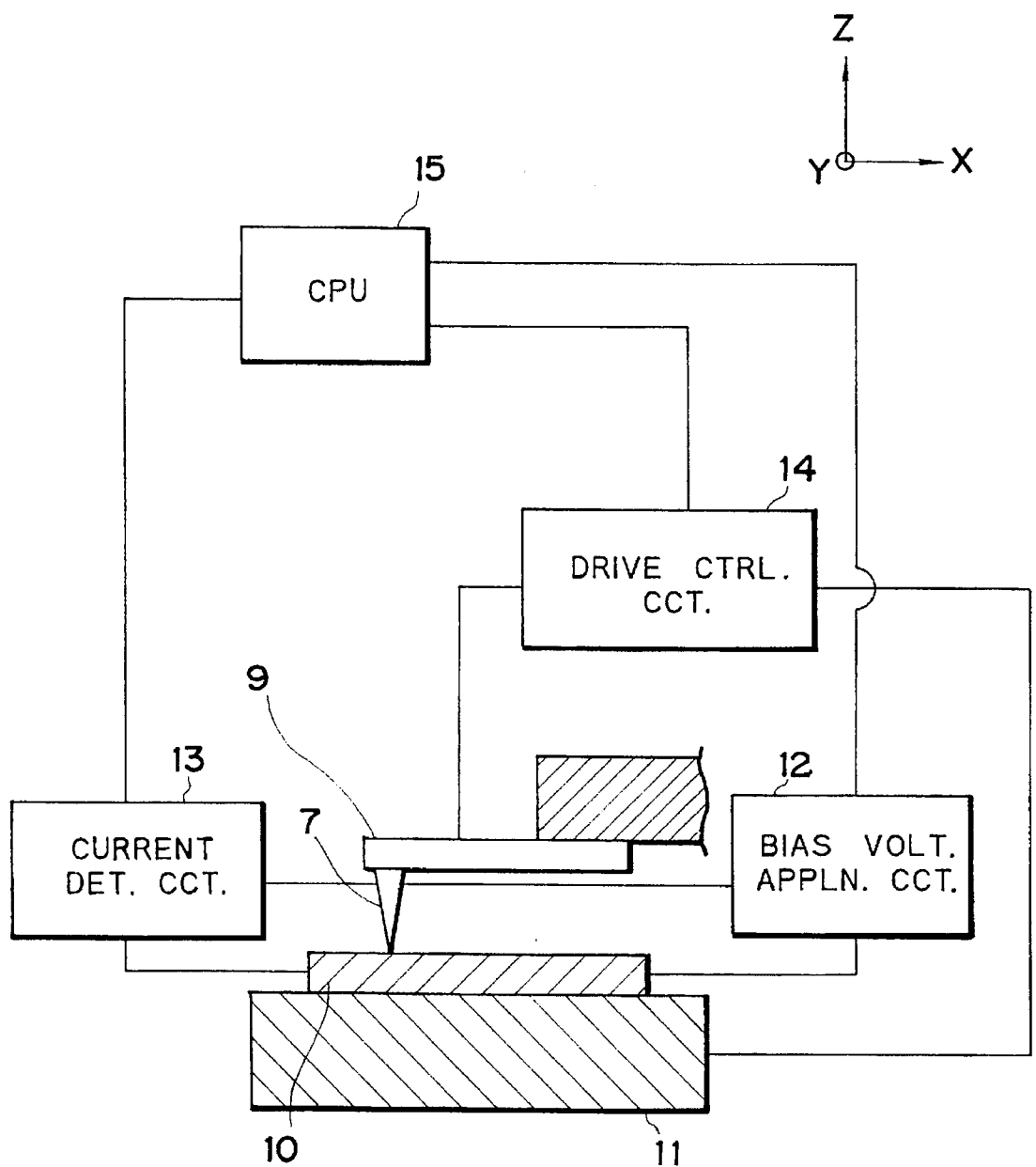
FIG. 4 is a block diagram of an information processing apparatus based on the principle of the STM employing the cantilever type probe of the present invention.
Figure 5A:
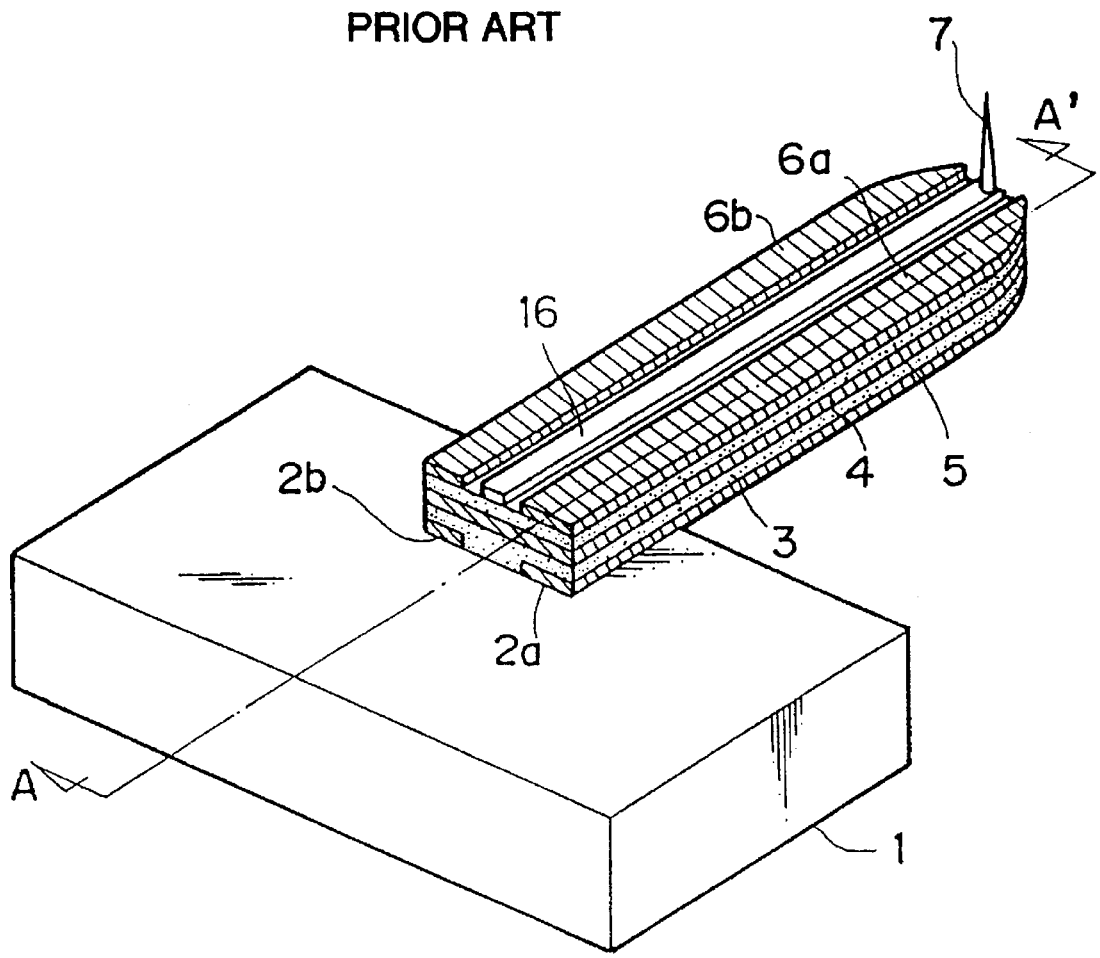
FIGS. 5A and 5B illustrate a cantilever type probe constituted of a piezoelectric bimorph of prior art.
Figure 5B:
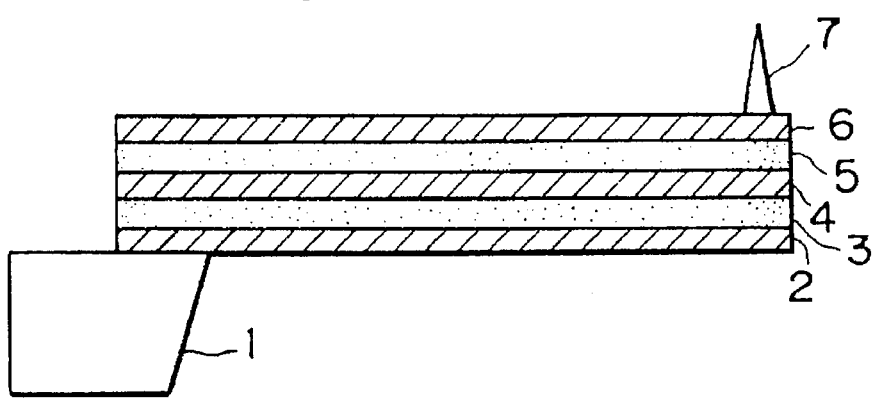

FIG. 4 shows an example of the information processing apparatus and the scanning tunneling microscope employing the above cantilever type probe of the present invention. The apparatus in FIG. 4 has a cantilever type probe 9 of the present invention, a sample 10 for recording-reproduction or microscopic observation, an x-y stage 11 for scanning of the sample, a bias voltage application circuit 12 for applying a bias voltage to the cantilever type probe 9, a tunnel current detecting circuit 13, a drive-controlling circuit 14 for driving the cantilever type probe, and a CPU 15 for controlling the entire apparatus.

Although only one cantilever type probe is shown in FIG. 4, the probe may be of a multi-cantilever type probe, which has a plurality of probes in integration.

Figure 6:
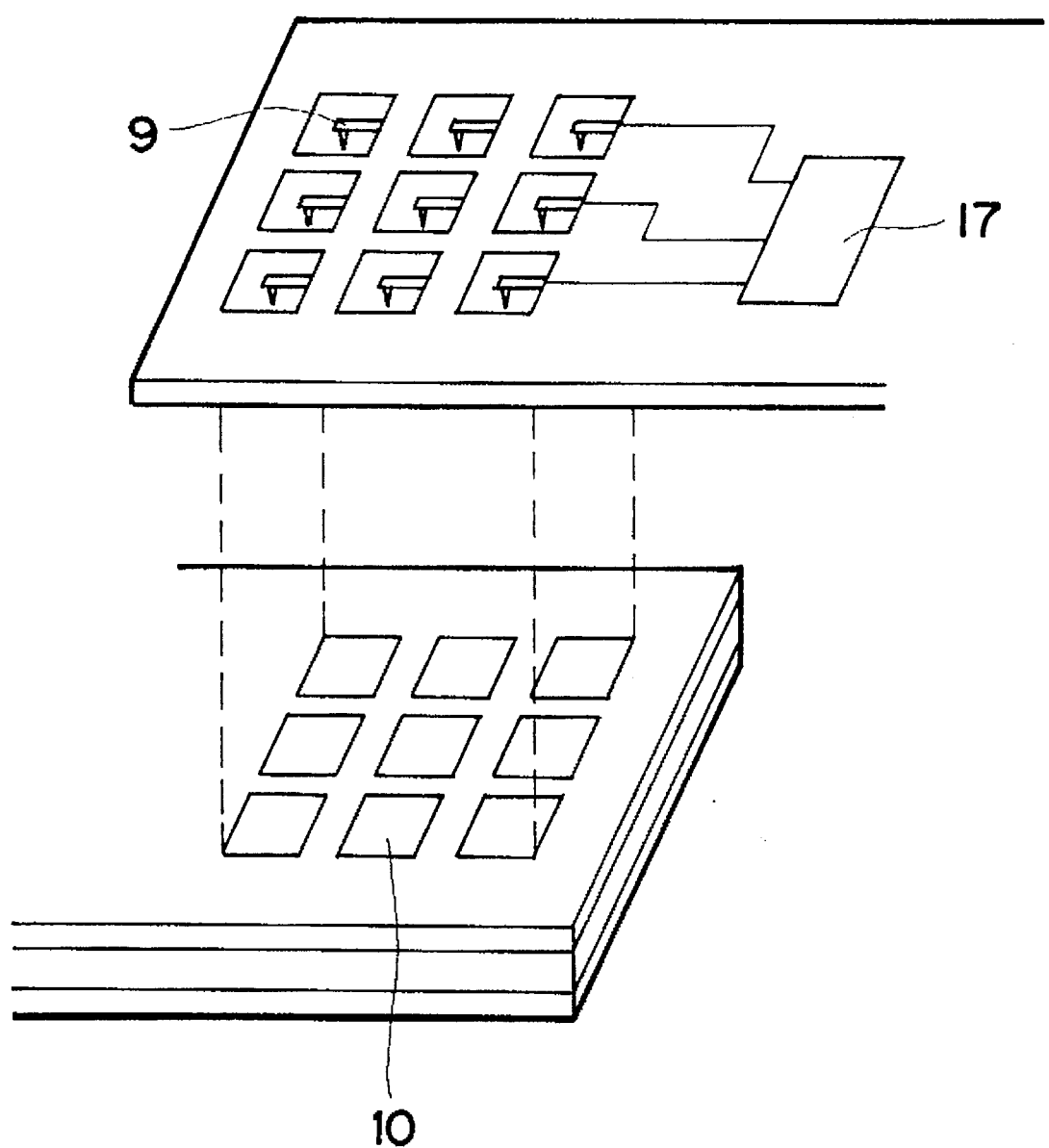
FIG. 6 illustrates roughly a multiplied and integrated multi-cantilever type probe, and an information processing apparatus and a scanning tunneling microscope.

FIG. 6 illustrates roughly a multi-cantilever type probe, and an information processing apparatus and a scanning tunneling microscope employing the multi-cantilever. In FIG. 6, the numeral 9 denotes a cantilever type probe of the present invention, the numeral 10 denotes a sample to be subjected to recording-reproduction or microscopic observation, and the numeral 17 denotes an IC for controlling a plurality of cantilever type probes. Although nine cantilever type probes are shown in FIG. 6, the probes may be provided in a desired number.

With this apparatus, image observation or recording-reproduction is conducted by using the tunneling current in such a manner that the tip 7 is brought close to the sample 10 by use of the cantilever type probe 9 (in z direction in FIG. 4), the face of the sample 10 is scanned with the tip in x and y directions by driving the x-y stage 11 with application of a voltage between the tip 7 and the sample 10 from the bias voltage application circuit 12, and tunneling current is read by the tunneling current detection circuit 13. The gap between the sample 10 and the tip 7, and the driving of the x-y stage are controlled by the drive controlling circuit 14. These circuits are controlled in sequence by CPU 15. The mechanism for scanning with the x-y stage 11, which is not shown in the drawing, include cylindrical piezo-actuators, parallel springs, actuation micrometers, voice coils, inch worms, and the like.

The information processing apparatus and the scanning tunneling apparatus employing the cantilever type probe of the present invention enables recording-reproduction of information with reliability and stability, and surface observation with high resolution.

The present invention is explained further by reference to examples.

EXAMPLE 1

A displacement element of the present invention was prepared through the steps shown in FIGS. 1A to 1E.

Firstly, a lower electrode 2 was formed on a substrate 1 as shown in FIG. 1A. The substrate was a single crystal Si plate having thereon a 0.2-μm thick $Si_3N_4$ layer deposited as a mask layer for anisotropic etching described later. The lower electrode 2 was formed from Pt by RF sputtering in a thickness of 0.1 μm by using 0.5 mTorr Ar gas as the sputtering gas at the RF power of 500 W without heating the substrate.

The Pt thin film was evaluated for crystal orientation by X-ray diffraction. Consequently, the ratio of the intensity $I_{(200)}$ caused by the crystal plane (200) to the intensity $I_{(111)}$ caused by the crystal plane (111) namely $I_{(200)}/I_{(111)}$, was 0.01.

Then, a first piezoelectric film 3 was formed thereon in a thickness of 0.3 μm as shown in FIG. 1B from a piezoelectric material ZnO by RF magnetron sputtering by use of sintered ZnO as the target in a gas atmosphere of a 1:1 mixture of Ar and $O_2$ at a total pressure of 15 mTorr at substrate temperature of 200° C.

Further thereon, an intermediate electrode 4, a second piezoelectric film 5, and an upper electrode 6 were formed successively in the named order as shown in FIG. 1C. The intermediate electrode 4 and the upper electrode 6 were formed in the same manner as the lower electrode 2, and the second piezoelectric film 5 was formed in the same manner as the first piezoelectric film 3.

The unnecessary portion was removed by conventional lithography, and the substrate under the element was removed except for the one end portion of the element by anisotropic etching by use of an aqueous potassium hydroxide solution as shown in FIG. 1D. Thus the displacement element was completed. The displacement element of this Example had a length of 500 µm, and a width of 50 µm.

The resulting thin film cantilever type displacement element was found to be displaced at the free end of the cantilever by ±3 µm vertically in FIG. 1D on application of a voltage of ±3 V between the lower electrode 2 and the intermediate electrode 4, or between the intermediate electrode 4 and the upper electrode 6.

Neither cracking nor peeling of a film in the element was observed after the formation of the element and during driving of the element. The driving of the element was found to be not disturbed by peeling or cracking of the film.

A cantilever type probe was prepared by providing a tip 7 for information input or output at a free end portion of the above displacement element as shown in FIG. 1E. The tip was formed by bonding of a metal piece or depositing a metal film and working it in a shape of a needle.

With this cantilever type probe, an information processing apparatus employing STM was prepared as shown in FIG. 4.

By use of this apparatus, a surface of an HOPG (graphite) plate as the sample 10 was observed by applying DC voltage of 200 mV between the tip 7 and the sample 10 from the bias voltage application circuit 12, scanning the surface of the sample 10 with the tip 7, and detecting the signal by the tunneling current detection circuit 13. A satisfactory atomic image was obtained over the scanned area of 0.05 µm×0.05 µm. As described above, the recording and reproduction of information, and surface observation were practically conducted according to the principle of STM.

EXAMPLE 2

A displacement element of the present invention was prepared through the steps shown in FIGS. 1A to 1E.

Firstly, a lower electrode 2 was formed on a substrate 1 as shown in FIG. 1A. The substrate was a single crystal Si plate having thereon a 0.2-µm thick $Si_3N_4$ layer deposited as a mask layer for anisotropic etching described later.

The lower electrode 2 was formed from Pt by RF sputtering. In this Example, prior to the Pt film formation, an adhesion layer was formed from Ti by using 2 mTorr of Ar as the sputtering gas at a RF power of 100 W in a thickness of 2 nm. Then a Pt film was formed in a thickness of 0.1 µm by using 0.5 mTorr Ar gas as the sputtering gas at the RF power of 500 W without heating the substrate.

The Pt thin film was evaluated for crystal orientation by X-ray diffraction. Consequently, the ratio of the intensity $I_{(200)}$ caused by the crystal plane (200) to the intensity $I_{(111)}$ caused by the crystal plane (111) namely $I_{(200)}/I_{(111)}$, was 0.015.

Then, a first piezoelectric film 3 was formed thereon in a thickness of 1.0 µm as shown in FIG. 1B from a piezoelectric material AlN by resistance heating deposition by using Al as the evaporated material and blowing $NH_3$ gas around the substrate at a substrate temperature of 200° C.

Further thereon, an intermediate electrode 4, a second piezoelectric film 5, and an upper electrode 6 were formed successively in the named order as shown in FIG. 1C. The intermediate electrode 4 and the upper electrode 6 were formed in the same manner as the lower electrode 2 except that the adhesion layer was not formed, and the second piezoelectric film 5 was formed in the same manner as the first piezoelectric film 3.

The unnecessary portion was removed by conventional lithography, and the substrate under the element was removed except the one end portion of the element by anisotropic etching by use of an aqueous potassium hydroxide solution. Thus a displacement element was completed. The displacement element of this Example had a length of 500 µm, and a width of 50 µm.

The resulting thin film cantilever type displacement element was found to be displaced at the free end of the cantilever by ±1.5 µm vertically in FIG. 1D on application of a voltage of ±3 V between the lower electrode 2 and the intermediate electrode 4 or between the intermediate electrode 4 and the upper electrode 6.

Neither cracking nor peeling of a film in the element was observed after the formation of the element and during driving of the element. The driving of the element was found to be not disturbed by peeling or cracking of the film.

A cantilever type probe was prepared by providing a tip 7 in the same manner as in Example 1 as shown in FIG. 1E. With this cantilever type probe, an information processing apparatus employing STM was prepared as shown in FIG. 4. The recording and reproduction of information, and the surface observation were practically conducted according to the principle of STM in the same manner as in Example 1 to obtain similar results.

EXAMPLE 3

A displacement element of the present invention was prepared through the steps shown in FIGS. 1A to 1E.

Firstly, a lower electrode 2 was formed on a substrate 1 as shown in FIG. 1A. The substrate was a single crystal Si plate having thereon a 0.2-µm thick $Si_3N_4$ layer as a mask layer for anisotropic etching described later, which was the same as the one in Examples 1 and 2. A lower electrode 2 was formed from Pd by RF sputtering in a thickness of 0.1 µm by using 0.5 mTorr Ar gas as the sputtering gas at the RF power of 500 W without heating the substrate.

The Pd thin film was evaluated for crystal orientation by X-ray diffraction. Consequently, the ratio of the intensity $I_{(200)}$ caused by the crystal plane (200) to the intensity $I_{(111)}$ caused by the crystal plane (111) namely $I_{(200)}/I_{(111)}$, was 0.015.

Then, a first piezoelectric film 3 was formed thereon in a thickness of 0.3 µm as shown in FIG. 1B from a piezoelectric material ZnO by RF magnetron sputtering by use of sintered ZnO as the target in a gas atmosphere of a 1:1 mixture of Ar and $O_2$ at a total pressure of 15 mTorr at substrate temperature of 200° C.

Further thereon, an intermediate electrode 4, a second piezoelectric film 5, and an upper electrode 6 were formed successively in the named order as shown in FIG. 1C. The intermediate electrode 4 and the upper electrode 6 were formed in the same manner as the lower electrode 2, and the second piezoelectric film 5 was formed in the same manner as the first piezoelectric film 3.

The unnecessary portion was removed by conventional lithography, and the substrate under the element was removed except for the one end portion of the element by anisotropic etching by use of an aqueous potassium hydroxide solution as shown in FIG. 1D. Thus the displacement element was completed. The displacement element of this Example had a length of 500 µm, and a width of 50 µm.

The resulting thin film cantilever type displacement element was found to be displaced at the free portion of the cantilever by ±3 µm vertically in FIG. 1D on application of a voltage of ±3 V between the lower electrode 2 and the intermediate electrode 4 or between the intermediate electrode 4 and the upper electrode 6.

Neither cracking nor peeling of a film in the element was observed after the formation of the element and during driving of the element. The driving of the element was found to be not disturbed by cracking or peeling of the film.

A cantilever type probe was prepared by providing a tip 7 in the same manner as in Example 1 as shown in FIG. 1E. With this cantilever type probe, an information processing apparatus employing STM was prepared as shown in FIG. 4. The recording and reproduction of information, and the surface observation were practically conducted according to the principle of STM in the same manner as in Example 1 to obtain similar results.

Thus the same satisfactory results were obtained by use of Pd in place of Pt as the electrode material.

EXAMPLE 4

A displacement element of the present invention was prepared through the steps shown as cross-sectional views in FIGS. 2A to 2D.

The element of this Example has a structure different from the ones in Examples 1 to 3 in that the piezoelectric film is a monolayer and an elastic layer is provided for causing displacement.

Figure 2A:
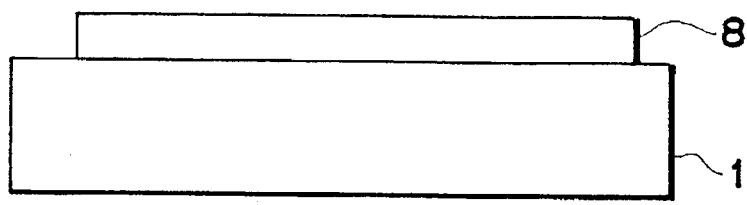
FIGS. 2A to 2D illustrate roughly another typical example of the displacement element and the cantilever type probe, and a process for production thereof of the present invention.

Firstly, an elastic film 8 was formed on a single crystal Si substrate 1 as shown in FIG. 2A. The elastic film is formed from $Si_3N_4$ by CVD in a thickness of 0.2 µm. The elastic film 8 was patterned into a desired shape by dry etching with $CF_4$.

Figure 2B:
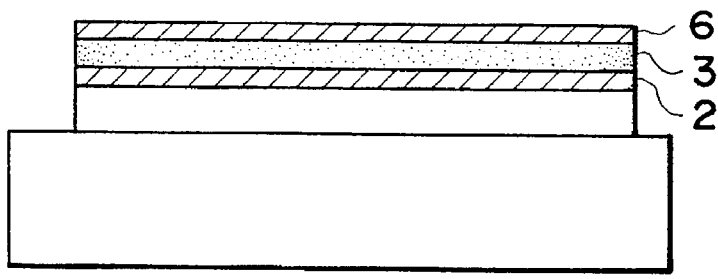

Then a lower electrode 2 was formed as shown in FIG. 2B. The lower electrode 2 was formed from Pt by RF sputtering in a thickness of 0.1 µm by using 0.5 mTorr Ar gas as the sputtering gas at the RF power of 500 W without heating the substrate.

The Pt thin film was evaluated for crystal orientation by X-ray diffraction. Consequently, the ratio of the intensity $I_{(200)}$ caused by the crystal plane (200) to the intensity $I_{(111)}$ caused by the crystal plane (111) namely $I_{(200)}/I_{(111)}$, was 0.01.

Then, a piezoelectric film 3 was formed thereon in a thickness of 0.3 µm from a piezoelectric material ZnO by RF magnetron sputtering by use of sintered ZnO as the target in a gas atmosphere of a 1:1 mixture of Ar and $O_2$ at a total pressure of 15 mTorr at substrate temperature of 200° C. Further thereon, an upper electrode 6 was deposited in the same manner as the lower electrode 2.

Figure 2C:
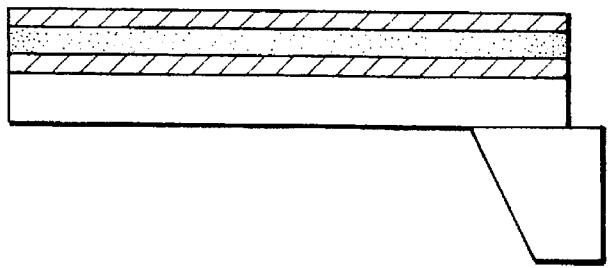

The unnecessary portion was removed by conventional lithography, and the substrate under the element was removed except for the one end portion of the element by anisotropic etching by use of an aqueous potassium hydroxide solution as shown in FIG. 2C. Thus the displacement element was completed. The displacement element of this Example had a length of 500 µm, and a width of 50 µm.

The resulting thin film cantilever type displacement element was found to be displaced at the free end of the cantilever by ±1 µm vertically in FIG. 2 on application of a voltage of +3 V between the lower electrode 2 and the upper electrode 6.

Neither cracking nor peeling of a film in the element was observed after the formation of the element and during driving of the element. The driving of the element was found to be not disturbed by peeling or cracking of the film.

Figure 2D:
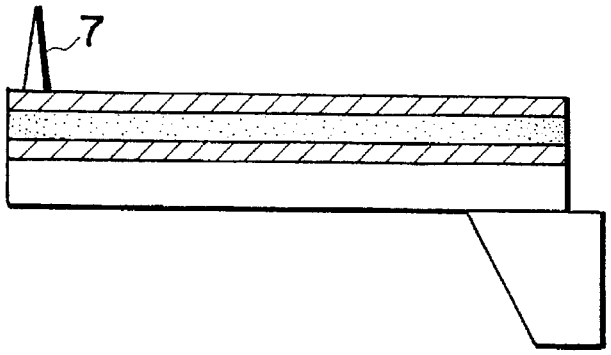

A cantilever type probe was prepared by providing a tip 7 in the same manner as in Example 1 as shown in FIG. 2D. With this cantilever type probe, an information processing apparatus employing STM was prepared as shown in FIG. 4. The recording and reproduction of information, and the surface observation were practically conducted according to the principle of STM in the same manner as in Example 1 to obtain similar results.

The same satisfactory results were obtained with an element prepared in the same manner by use of Pd in place of Pt as the electrode material.

As shown in this Example, the use of Pt or Pd as the electrode is also effective for a displacement element of a construction having an elastic layer.

EXAMPLE 5

A displacement element of the present invention was prepared through the steps shown in FIGS. 1A to 1D.

Firstly, a lower electrode 2 was formed on a substrate 1 as shown in FIG. 1A. The substrate was a single crystal Si plate having thereon a 0.2-µm thick $Si_3N_4$ layer as a mask layer for anisotropic etching described later, which was the same as the one in Examples 1 to 3. The lower electrode 2 was formed from Pt by electron beam vapor deposition in a thickness of 0.2 µm. In this Example, a Ti film was formed in a thickness of 5 nm as a adhesion layer for Pt.

The Pt thin film was evaluated for crystal orientation by X-ray diffraction. Consequently, the ratio of the intensity $I_{(200)}$ caused by the crystal plane (200) to the intensity $I_{(111)}$ caused by the crystal plane (111) namely $I_{(200)}/I_{(111)}$, was 0.015.

Then, a first piezoelectric film 3 was formed thereon in a thickness of 1.0 µm as shown in FIG. 1B from a piezoelectric material ZnO by RF magnetron sputtering by use of sintered ZnO as the target in a gas atmosphere of a 1:1 mixture of Ar and $O_2$ at a total pressure of 15 mTorr at substrate temperature of 200° C.

Further thereon, an intermediate electrode 4, a second piezoelectric film 5, and an upper electrode 6 were formed successively in the named order as shown in FIG. 1C. The intermediate electrode 4 and the upper electrode 6 were formed in the same manner as the lower electrode 2, and the second piezoelectric film 5 was formed in the same manner as the first piezoelectric film 3.

The unnecessary portion was removed by conventional lithography, and the substrate under the element was removed except the one end portion of the element by anisotropic etching by use of an aqueous potassium hydroxide solution as shown in FIG. 1D. Thus the displacement element was completed. The displacement element of this Example had a length of 500 µm, and a width of 50 µm.

The resulting thin film cantilever type displacement element was found to be displaced at the free end of the cantilever by ±3 µm vertically in FIG. 1D on application of a voltage of ±3 V between the lower electrode 2 and the intermediate electrode 4 or between the intermediate electrode 4 and the upper electrode 6.

Neither crack nor peeling of a film in the element was observed after the formation of the element and during driving of the element. The driving of the element was found to be not disturbed by peeling or cracking of the film.

As described above, the cantilever type displacement element has extremely small internal stress in the electrode films even after the formation thereof, and therefore peeling at the interface between the piezoelectric film and the electrode does not occur, and a thin film cantilever type displacement element capable of being integrated is provided in a high yield.

The information processing apparatus and the scanning tunneling microscope employing the cantilever type probe which is constituted of the above displacement element and a tip for information input and output at the free end of the cantilever enable recording and reproduction of information with high reliability and stability, and surface observation with high resolution.

What is claimed is:

1. A cantilever type displacement element comprising:

a piezoelectric film layer; and lower and upper electrode layers provided respectively on lower and upper faces of said piezoelectric layer to displace said film layer by converse piezoelectric effect, said electrode layers being formed of platinum or palladium, wherein said piezoelectric film layer is composed of either one of zinc oxide and aluminum nitride, and the crystal orientation in the platinum or palladium electrode layers is defined by the ratio of the intensity $I_{(200)}$ caused by a crystal plane (200) to the intensity $I_{(111)}$ of said lower electrode layer, measured by X-ray diffraction, in a range represented by the following relation:

$$I_{(200)}/I_{(111)} < 0.02.$$

2. A displacement element according to claim 1, wherein said piezoelectric film layer has a thickness of not less than 50 nm.

3. A displacement element according to claim 1, wherein each of said electrode layers has a thickness of not less than 20 nm.

4. A cantilever type probe, comprising:

a piezoelectric film layer;

lower and upper electrode layers provided respectively on lower and upper faces of said piezoelectric film layer to displace said film layer by converse piezoelectric effect, said electrode layers being formed of platinum or palladium and said piezoelectric film layer and electrode layers together forming a displacement element;

a substrate supporting one end of said displacement element; and a tip provided on a free end of said displacement element, wherein said piezoelectric film layer is composed of either one of zinc oxide and aluminum nitride, and the crystal orientation in the platinum or palladium electrode layers is defined by the ratio of the intensity $I_{(200)}$ caused by a crystal plane (200) to the intensity $I_{(111)}$ of said lower electrode layer, measured by X-ray diffraction, in a range represented by the following relation:

$$I_{(200)}/I_{(111)} < 0.02.$$

5. A cantilever type probe according to claim 4, wherein said tip is made of a metal.

6. A cantilever type probe according to claim 4, further comprising a voltage application circuit connected to said displacement element.

7. A cantilever type probe according to claim 6, wherein said tip is made of a metal.

8. A scanning tunneling microscope, comprising:

a cantilever type probe having a piezoelectric film layer, lower and upper electrode layers provided respectively on lower and upper faces of said piezoelectric film layer to displace said film layer by converse piezoelectric effect, said electrode layers being formed of platinum or palladium and said piezoelectric film layer and electrode layers together forming a displacement element;

a substrate supporting one end of said displacement element;

a tip provided on a free end of said displacement element;

a stage positioned opposite to said cantilever type probe for supporting a sample thereon; and said piezoelectric film layer is composed of either one of zinc oxde and aluminum nitride, and the crystal orientation in the platinum or palladium electrode layers is defined by the ratio of the intensity $I_{(200)}$ caused by a crystal plane (200) to the intensity $I_{(111)}$ of said lower electrode layer, measured by X-ray diffraction, in a range represented by the following relation:

$$I_{(200)}/I_{(111)} < 0.02.$$

9. A scanning tunnelling microscope according to claim 8, wherein said tip is made of a metal.

10. A scanning tunneling microscope according to claim 8, wherein a plurality of cantilever type probes are provided to observe the sample.

11. An information processing apparatus comprising:

a cantilever type probe having a piezoelectric film layer, lower and upper electrode layers provided respectively on lower and upper faces of said piezoelectric film layer to displace said film layer by converse piezoelectric effect, said electrode layers being formed of platinum or palladium and said piezoelectric film layer and electrode layers together forming a displacement element;

a substrate supporting one end of said displacement element;

a tip provided on a free end of said displacement element;

a stage positioned opposite to said cantilever type probe for supporting a medium thereon; and control means for recording information on or reproducing information from the medium with said cantilever type probe, wherein said piezoelectric film layer is composed of either one of zinc oxide and aluminum nitride, and the crystal orientation in the platinum or palladium electrode layers is defined by the ratio of the intensity $I_{(200)}$ caused by a crystal plane (200) to the intensity $I_{(111)}$ of said lower electrode layer, measured by X-ray diffraction, in a range represented by the following relation:

$$I_{(200)}/I_{(111)} < 0.02.$$

12. An information processing apparatus according to claim 11, wherein said tip is made of a metal.

13. An information processing apparatus of claim 11, wherein a plurality of cantilever type probes are provided to observe the medium.

* * * * *

UNITED STATES PATENT AND TRADEMARK OFFICE
CERTIFICATE OF CORRECTION

PATENT NO. : 5,631,463
DATED : May 20, 1997
INVENTOR(S) : Kawasaki et al.

It is certified that error appears in the above-indentified patent and that said Letters Patent is hereby corrected as shown below:

On title page,

[56] REFERENCES CITED:

OTHER PUBLICATIONS, "G. Binning et al.," should read --G. Binnig, et al.,--.

[57] ABSTRACT:

Line 3, "convence" should read --converse--.

COLUMN 11:

Line 10, "piezoelectric" should read --piezoelectric film--.
Line 11, "film" should read --piezoelectric film--.

COLUMN 12:

Line 11, "and" should read --and ¶ control means for controlling observation of the sample with said cantilever type probe, wherein--.
Line 13, "oxde" should read --oxide--.

Signed and Sealed this

Twenty-fourth Day of March, 1998

Attest:

BRUCE LEHMAN

*Attesting Officer*     Commissioner of Patents and Trademarks